United States Patent
Divoux

(10) Patent No.: US 6,337,605 B1
(45) Date of Patent: Jan. 8, 2002

(54) TEMPERATURE COMPENSATED OSCILLATOR

(75) Inventor: Jean-Noël Divoux, La Chaux-de-Fonds (SE)

(73) Assignee: EM Microelectronic-Marin SA, Marin (CH)

( * ) Notice: Subject to any disclaimer, the term of this patent is extended or adjusted under 35 U.S.C. 154(b) by 0 days.

(21) Appl. No.: 09/600,807

(22) PCT Filed: Jan. 21, 1999

(86) PCT No.: PCT/CH99/00028

§ 371 Date: Jul. 24, 2000

§ 102(e) Date: Jul. 24, 2000

(87) PCT Pub. No.: WO99/38260

PCT Pub. Date: Jul. 29, 1999

(30) Foreign Application Priority Data

Jan. 23, 1998 (WO) ............................. PCT/CH98/00024

(51) Int. Cl.[7] ............................. H03B 5/04; H03B 5/24
(52) U.S. Cl. ......................... 331/176; 331/143; 331/144
(58) Field of Search ................................. 331/126, 111, 331/113 R, 143, 144, 145, 153

(56) References Cited

U.S. PATENT DOCUMENTS

| | | |
|---|---|---|
| 5,180,995 A | 1/1993 | Hayashi et al. |
| 5,448,103 A | 9/1995 | de Wit |
| 5,604,467 A | 2/1997 | Matthews |
| 5,699,024 A | 12/1997 | Manlove et al. |
| 5,870,004 A * | 2/1999 | Lu .............................. 331/176 |

FOREIGN PATENT DOCUMENTS

DE  43 40 924  6/1995

OTHER PUBLICATIONS

Patent Abstracts of Japan, vol. 011, No. 065 (E–484), Feb. 27, 1987.

* cited by examiner

*Primary Examiner*—David Mis
(74) *Attorney, Agent, or Firm*—Griffin & Szipl, P.C.

(57) ABSTRACT

The present invention concerns an oscillator (20) intended to supply a periodic electric voltage (Vo) at a predetermined frequency (f). This oscillator includes: a reference source (23) able to provide a reference voltage (Vref), this reference source including a resistor (R) linked to said voltage; and supply means (24) able to receive the reference voltage and to supply said periodic voltage at said predetermined frequency, the supply means having a first temperature coefficient ($\alpha_{24}$) so this frequency can vary under the influence of the temperature. This oscillator is characterised in that the resistor is formed to give the reference source a second temperature coefficient ($\alpha_{23}$) equal to the first temperature coefficient, so that the temperature has the same influence on the reference voltage and on the supply means, which allows the periodic voltage to be supplied independently of the temperature.

7 Claims, 6 Drawing Sheets

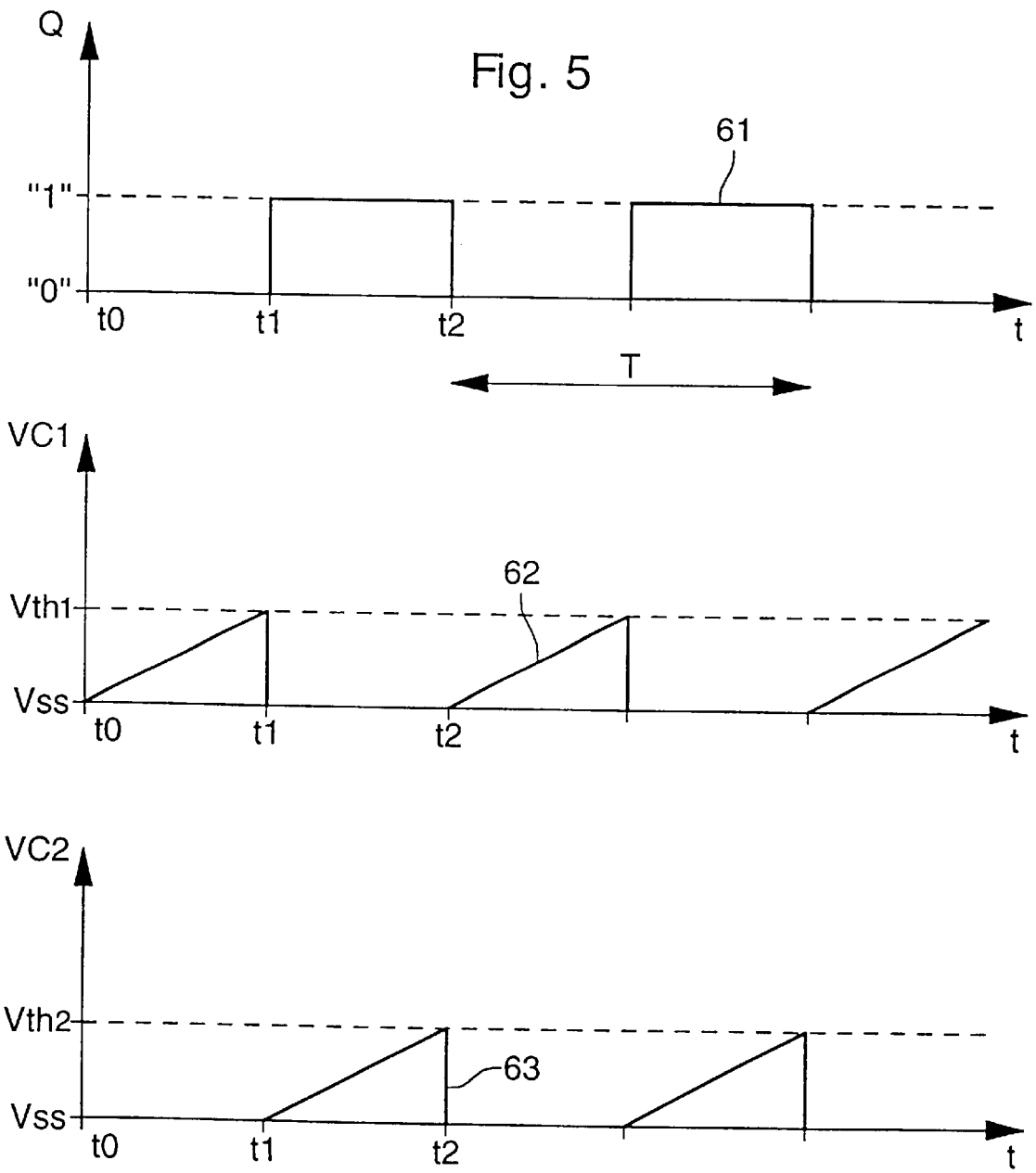

TEMPERATURE COMPENSATED OSCILLATOR

FIELD OF THE INVENTION

The present invention concerns integrated circuits and, more precisely, temperature compensated oscillators.

In the present description, an oscillator is defined as a circuit able to provide periodic signals having a predetermined frequency which is substantially constant.

DISCUSSION OF THE PRIOR ART

One problem encountered in providing such a frequency lies in the fact that it varies as a function of the temperature with an intrinsic temperature coefficient (of the oscillator), which is detrimental when the oscillator is intended to be used as a time base.

A large number of temperature compensated oscillators intended to overcome this problem exist in the state of the art, in particular in U.S. Pat. Nos. 5,604,467 and 5,180,995.

FIGS. 1a and 1b of the present description show oscillators 1 and 10 such as those described in U.S. Pat. Nos. 5,604,467 and 5,180,995 respectively.

As is shown in FIG. 1a, oscillator 1 includes a reference source 3 and supply means 5. Reference source 3 is arranged to supply a current I to supply means 5, and is temperature compensated so that the intensity of current I is constant, independently of the temperature. Supply means 5 include a capacitor 6 charged via the injection of current I, and is arranged to compare the voltage present across the terminals of capacitor 6 to a reference voltage Vref, and to supply in response a periodic signal CLK.

One drawback of such an oscillator lies in the fact that it does not allow the influence of the temperature on supply means 5 to be compensated, the latter having an intrinsic temperature coefficient. As a result, the frequency of signal CLK can vary under the influence of the temperature, via the temperature coefficient of supply means 5.

As FIG. 1b shows, oscillator 10 includes supply means 14 provided with inverters 15a to 15g and a reference source 12 provided with a constant voltage generator 13 and two resistors R1 and R2, the latter being formed so as to have positive and negative temperature coefficients respectively. Thus, following a temperature increase, the signal frequency φo tends to decrease in accordance with the temperature characteristics of the oscillator itself and of resistor R1, and tends to increase the temperature characteristic of resistor R2.

One drawback of oscillator 10 lies in the fact that, in order to prevent it becoming locked on a parasitic frequency, it has to include prime number of inverters (7 here), which causes a considerable occupation of surface area.

One drawback of resistor R2 lies in the fact that it has to have a negative temperature coefficient, while the resistors manufactured in integrated circuits generally have positive temperature coefficients.

Another drawback of resistor R2 lies in the fact that it is formed in a zone of polycrystalline silicon which is a material with low resistivity. Thus, to have a high reference voltage, it is necessary either to form a high value resistor, which requires a considerable occupation of surface area, or provide a significant electric current to reference source 12 (typically of the order of $\mu A$), which causes a high level of consumption.

BRIEF SUMMARY OF THE INVENTION

An object of the present invention is to provide an oscillator able to compensate the influence of the temperature over all the oscillator components, so as to supply a periodic voltage at a predetermined frequency, independently of the temperature.

Another object of the present invention is to provide an oscillator which answers the constraints as regards space requirement and electric power consumption, which are usual in the integrated circuit industry.

Another object of the present invention is to provide an oscillator which can be manufactured via the standard integrated circuits manufacturing processes.

These objects, in addition to others, are achieved by the oscillator according to claim 1.

One advantage of the resistor of such an oscillator is that it gives the reference source an equal temperature coefficient to that of the supply means, so that the temperature has the same influence on that voltage and on that means. As a result, the supply of the periodic voltage at the desired frequency is independent of the temperature. In other words, the resistor thereby formed allows compensation of the frequency variations, under the influence of the temperature on the supply means.

Another advantage of the oscillator according to the present invention is that it is formed of known components, which can be made in a monolithic manner, which answers concerns as to space requirement and complexity.

These objects, features and advantages of the present invention, in addition to others, will appear more clearly upon reading the detailed description of a preferred embodiment of the invention, given solely by way of example, in relation to the annexed drawings.

BRIEF DESCRIPTION OF THE DRAWINGS

FIG. 5 shows three timing diagrams of the electric voltages present in the oscillator of FIG. 2.

DETAILED DESCRIPTION OF THE INVENTION

Figure 1A:
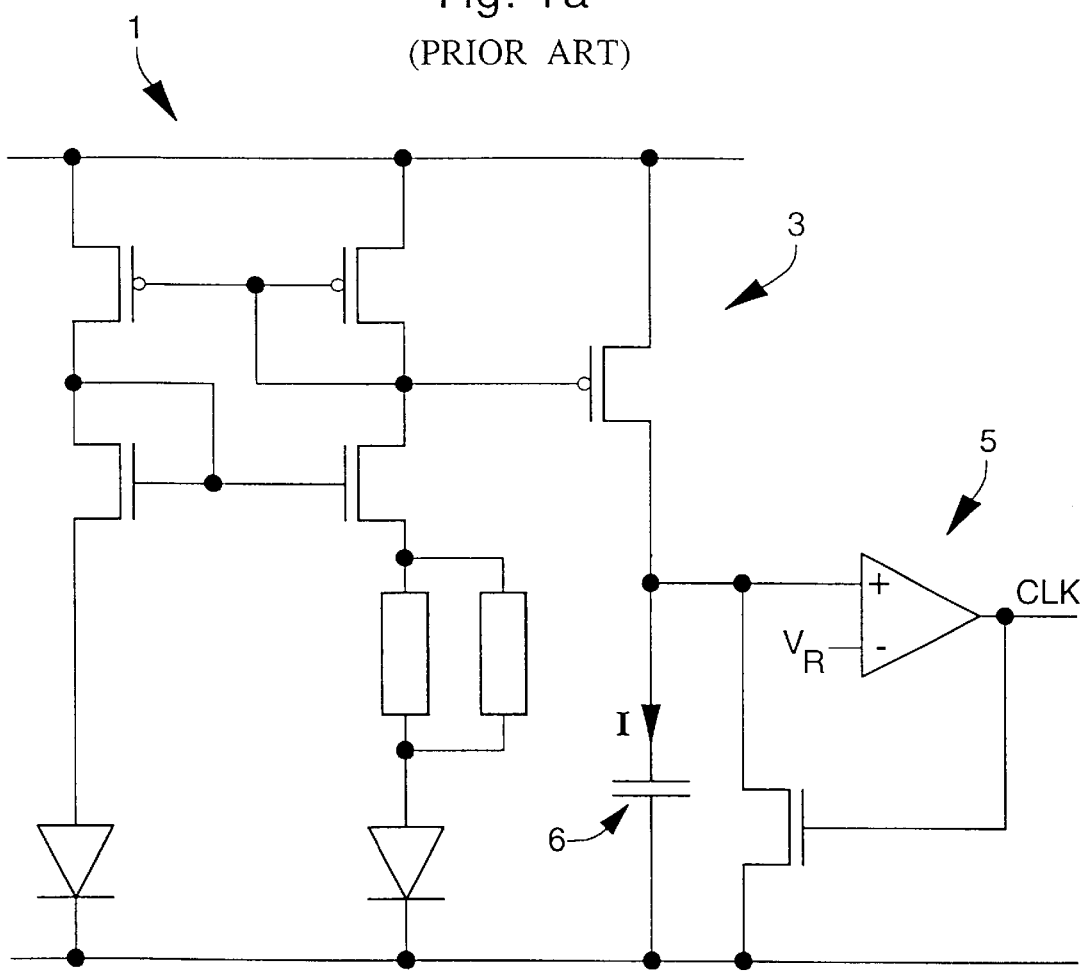
FIGS. 1a and 1b which have already been cited, show two temperature compensated oscillators according to the prior art.
Figure 1B:
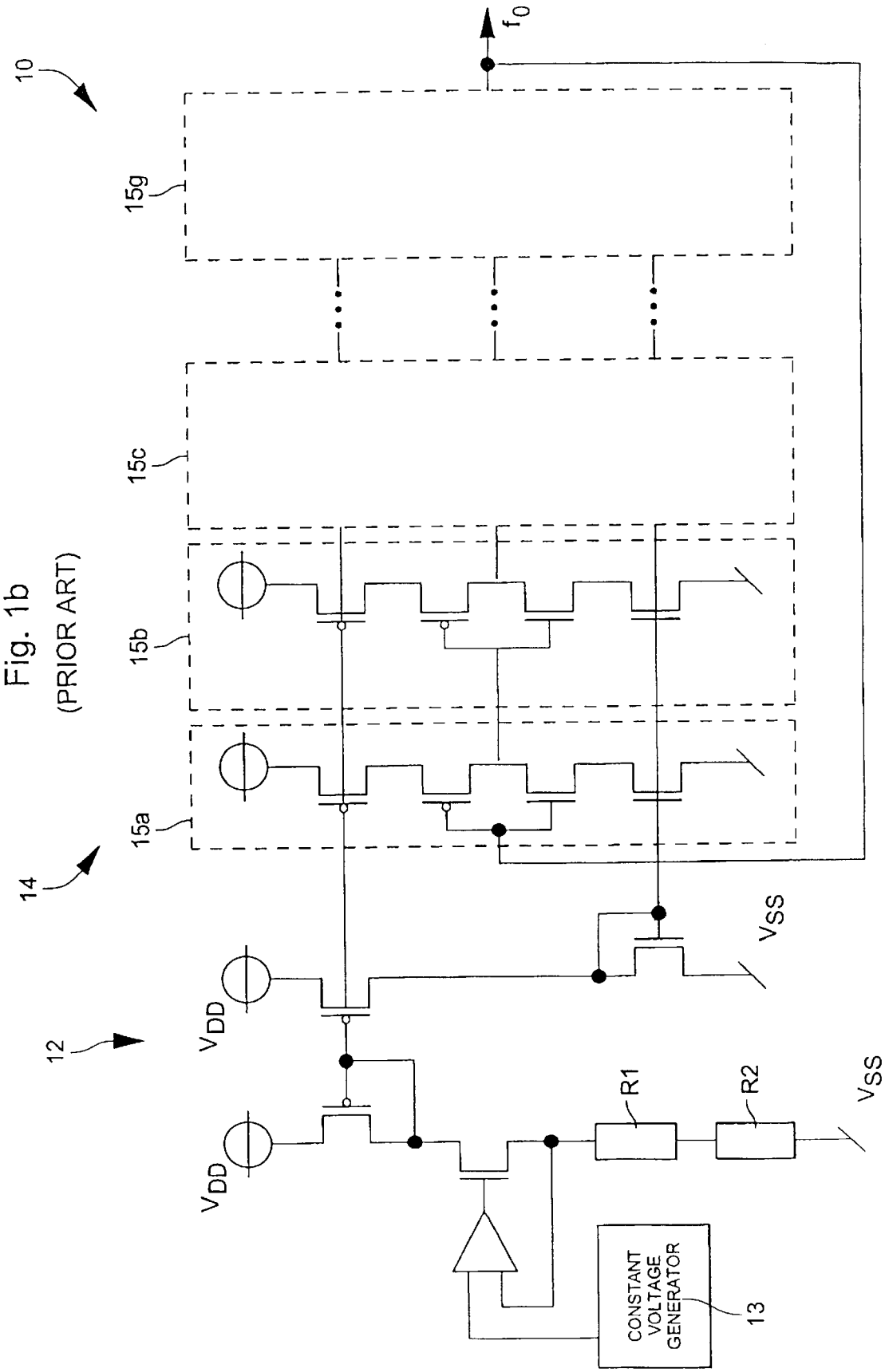

A preferred embodiment of an oscillator according to the present invention will be described with reference to FIG. 2 which shows an oscillator 20 able to provide a periodic voltage Vo at a predetermined frequency f.

For this purpose, oscillator 20 includes a reference source 23 able to provide a reference voltage Vref, and supply means 24 able to receive reference voltage Vref and to supply periodic voltage Vo at frequency f.

It is to be noted that supply means 24 have a temperature coefficient $\alpha_{24}$ such that frequency f can vary under the influence of the temperature. Within this meaning, the intrinsic variations are defined as the variations in frequency f, under the influence of the temperature on supply means 24.

Reference source 23 includes an output terminal 23a connected to supply means 24, to supply reference voltage Vref.

For this purpose, reference source 23 includes four field effect transistors T1 to T4 and a resistor R, as shown in FIG.

2. These components are arranged to form a reference source which is known, in particular from the article entitled "CMOS Analog Integrated Circuits based on Weak Inversion Operation", by E. Vittoz and J. Fellrath, which appeared in IEEE Journal of Solid States Circuits, Vol. SC-12, No. 3, June 1977, pp 224 to 231.

It is to be noted that the voltage present at the point of connection between transistors T3 and T4 corresponds to reference voltage Vref. It is also to be noted that the supply of reference voltage Vref is linked to resistor R, as is described in more detail hereinafter.

Supply means 24 include an input terminal 24a connected to terminal 23a of reference source 23, for receiving reference voltage Vref. Supply means 24 also include an output terminal 24b, for receiving periodic voltage Vo.

For this purpose, supply means 24 include two comparison means 26 and 28 and a flip-flop 29 connected in a loop with each of said means.

Flip-flop 29 includes two input terminals 29a and 29b connected respectively to comparison means 26 and 28, for receiving two comparison voltages U1 and U2, respectively. Flip-flop 29 also includes two output terminals 29c and 29d, for providing two output voltages Q and $\overline{Q}$ respectively.

For this purpose, flip-flop 29 is preferably made from a known RS flip-flop.

It is to be noted that terminal 24b of supply means 24 is connected, in this example, to terminal 29c of flip-flop 29, so that voltage Vo supplied by oscillator 20 corresponds to voltage Q. It goes without saying that terminal 24b of supply means 24 can be connected to terminal 29d of flip-flop 29, instead of terminal 29c.

Comparison means 26 include an input terminal 26a connected to terminal 24a of supply means 24, for receiving reference voltage Vref. Comparison means 26 also include an input terminal 26b connected to terminal 29c of flip-flop 29, for receiving output voltage Q. Comparison means 26 also include an output terminal 26c, connected to terminal 29a of flip-flop 29, for supplying comparison voltage U1. Comparison means 26 are arranged to compare reference voltage Vref to a voltage linked to voltage Q.

Figure 3:
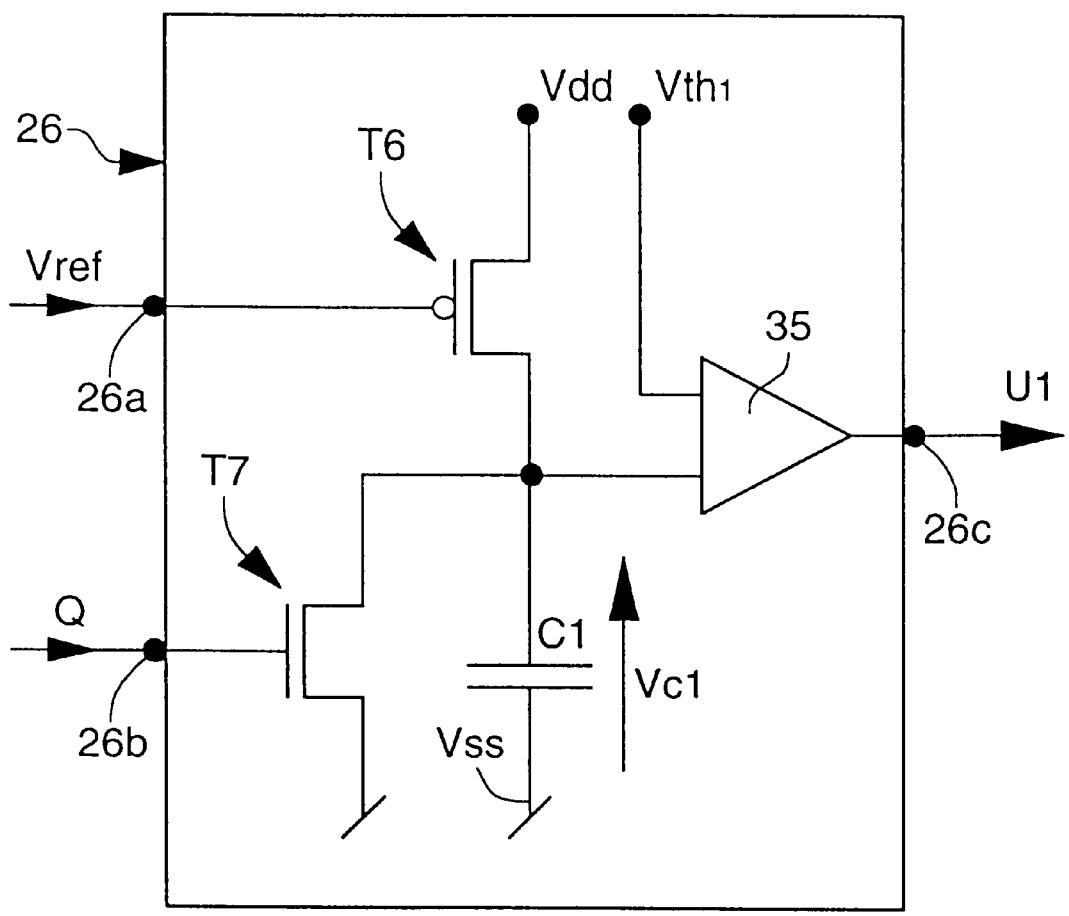
FIG. 3 shows comparison means of the oscillator of FIG. 2.

Thus, with reference to FIG. 3, comparison means 26 include an accumulator C1, a comparator 35 and two switches T6 and T7.

Accumulator C1 is connected, on the one hand, to the system's ground, and on the other hand, to a supply terminal for the system, via switch T6, as well as to the system's ground via switch T7. Preferably, accumulator C1 is formed by a known capacitor. It is to be noted that the reference VC1 designates the voltage present across the terminals of accumulator C1, and that the reference Vss designates the ground voltage of oscillator 20, in the following description.

Switches T6 and T7 are connected so as to be able to be controlled respectively by output voltage Q and reference voltage Vref. Preferably, each of switches T6 and T7 is formed by a known field effect transistor. It is to be noted that these two transistors are of opposite types (transistor T6 being of the PMOS type and transistor T7 of the NMOS type for example).

Comparator 35 is arranged so as to be able to receive voltage VC1 and a threshold voltage Vth1 supplied by threshold voltage supply means (not shown in FIG. 3). Comparator 35 is also arranged to compare voltage VC1 and threshold voltage Vth1, and to supply in response comparison voltage U1. Preferably, comparator 35 is formed by a known operational amplifier.

Comparison means 28 are formed like comparison means 26. Thus, comparison means 28 include in particular an accumulator or capacitor C2 and a comparator 36 able to compare a threshold voltage Vth2 and voltage VC2 present across the terminals of capacitor C2.

Those skilled in the art will note that the different components of supply means 24 give the latter a resulting temperature coefficient (i.e. $\alpha_{24}$). Thus, assuming that voltage Vref supplied by reference source 23 is constant, voltage Vo should tend to vary under the influence of the temperature, with a temperature coefficient $\alpha_1$.

In order to overcome this influence, reference source 23 is formed so as to have a temperature coefficient $\alpha_{23}$ equal to temperature coefficient $\alpha_{24}$, so that the temperature has the same influence on reference voltage Vref and on supply means 24, which allows periodic voltage Vo to be supplied independently of the temperature.

Essentially, resistor R is formed so that the temperature coefficient $\alpha_{23}$ is equal to temperature coefficient $\alpha_{24}$. Resistor R is thus formed to have a resulting temperature coefficient able to allow compensation of the intrinsic variations in frequency f, under the influence of the temperature on supply means 24.

Preferably, resistor R is made from one or more materials each having its own temperature coefficient, so as to have a resulting temperature coefficient such that temperature coefficient $\alpha_{23}$ is equal to temperature coefficient $\alpha_{24}$.

By way of illustration, in the following description, resistor R includes two resistors R1 and R2 formed respectively from two materials M1 and M2 having respectively temperature coefficients $\alpha 1$ and $\alpha 2$ which are different to each other.

Figure 4:
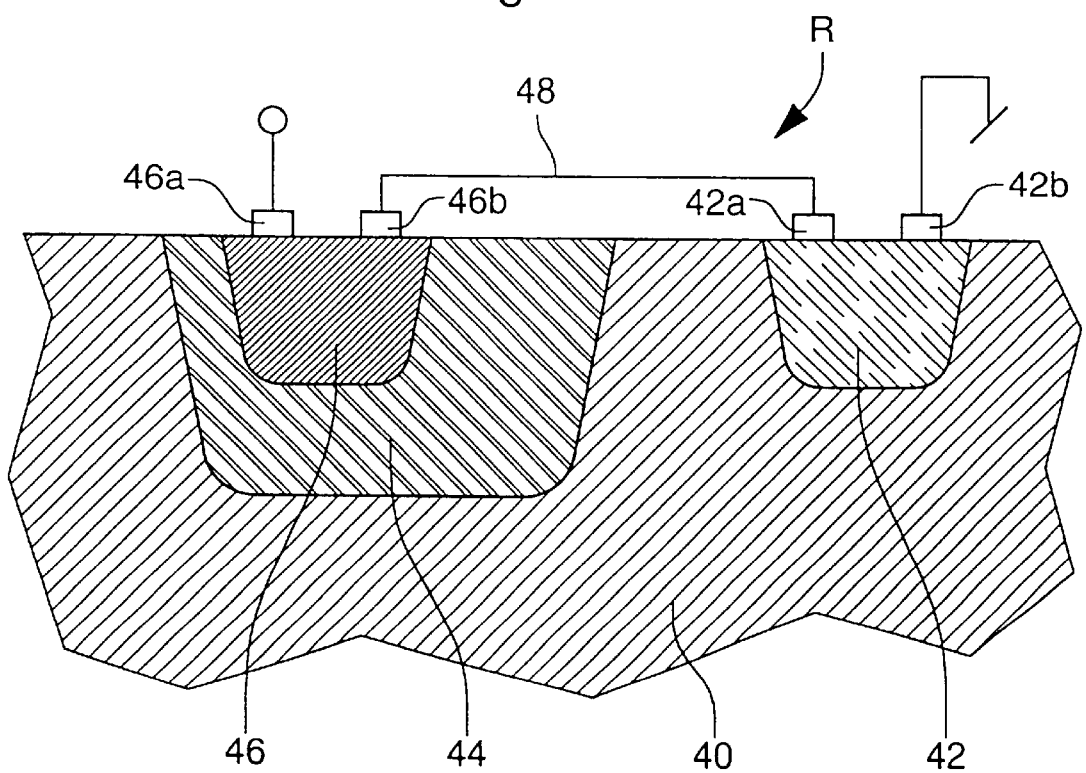
FIG. 4 shows in more detail a component of the oscillator of FIG. 2.

A preferred embodiment of resistor R will now be described, with reference to FIG. 4 showing in detail a cross-section of this resistor.

Figure 2:
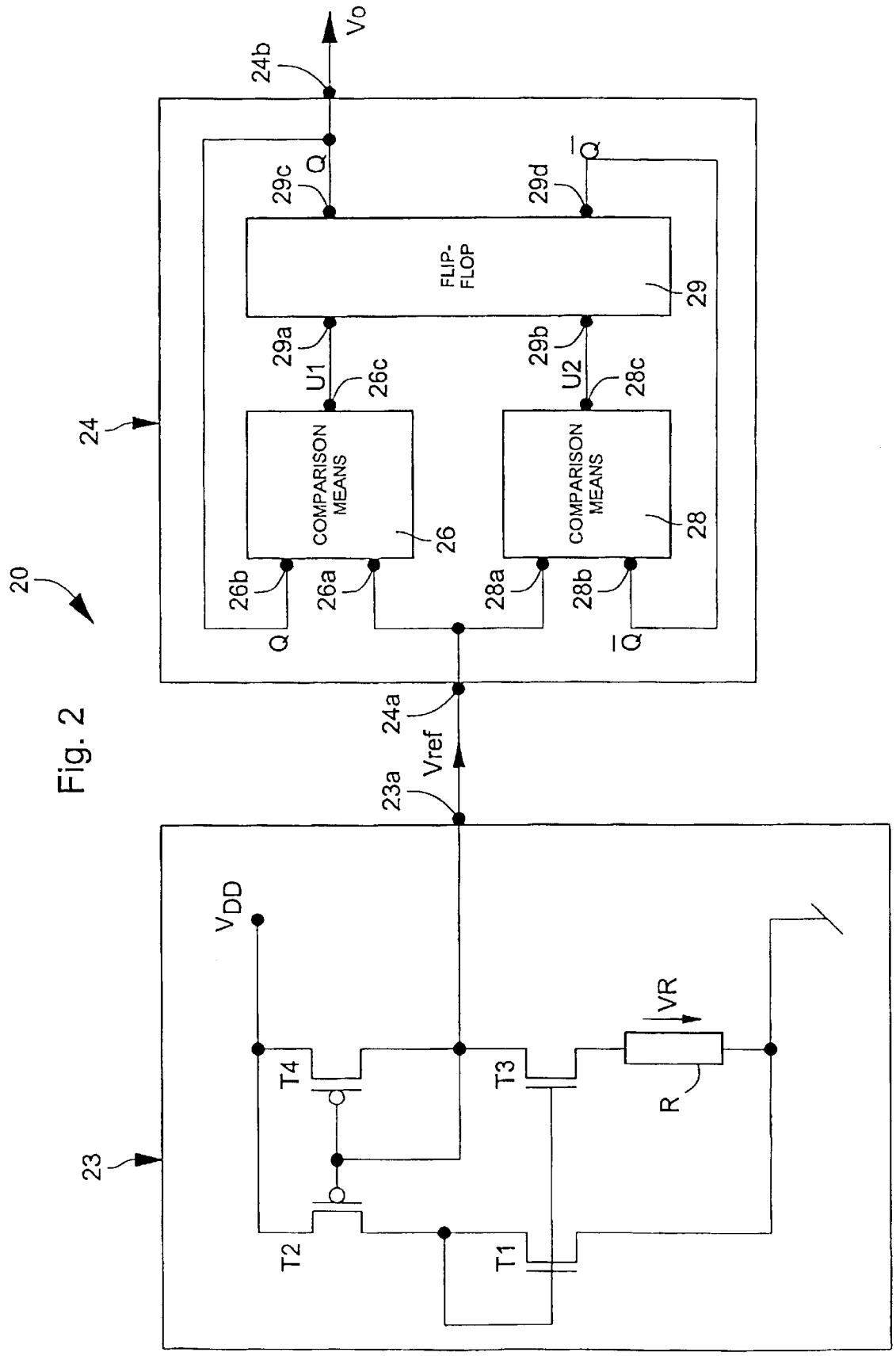
FIG. 2 shows an oscillator according to the present invention.

It will be noted that same objects in FIG. 4 to these ones described in relation to FIG. 2 have been designated with the same references.

As FIG. 4 shows, a well region 42 is formed in a semiconductor substrate 40 which has a first type of lightly doped conductivity (for example P−), by implanting impurities of a second type of lightly doped conductivity (i.e. N−, using the above example). Next, two connection terminals 42a and 42b, between which exists resistor R with temperature coefficient $\alpha 1$, are formed on well region 42. Likewise, another well region 44 is formed by implanting impurities of the second type of lightly doped conductivity (i.e. N−, using the above example). And, a diffusion zone 46 is formed in well region 44, by implanting impurities of the first type of highly doped conductivity (i.e. P+, using the above example). Then, two connection terminals 46a and 46b, between which there exists resistor R2 having temperature coefficient $\alpha 2$, are formed on diffusion zone 46.

Then, by connecting terminals 42a and 46b to each other, via a connection line 48, resistors R1 and R2 are thus connected in series. In a similar way to the structure shown in FIG. 2, terminal 42b is then connected to oscillator 20's ground, and terminal 46a is connected to the terminal 30a, which implements resistors R1 and R2 in reference source 23 as resistor R.

It is to be noted in the above example that materials M1 and M2 are respectively P+ type silicon forming a diffusion zone, and N− type silicon forming a well region.

Those skilled in the art will note that reference source 23 and supply means 24 can be formed in a monolithic manner in a single semiconductor substrate, via a usual process for manufacturing integrated circuits.

The operation of oscillator 20 will now be described, with reference to FIG. 5 which shows three timing diagrams 61 to 63 illustrating voltages Q, VC1 and VC2 respectively.

Let us consider that at an initial instant t0 voltage Q has a value "0". Transistor T7 is thus blocked and capacitor C1 is charged via transistor T6. Thus, voltage VC1 increases linearly over time t, as illustrated by wave shape 62. At an instant t1 subsequent to instant t0, voltage VC1 reaches threshold voltage Vth1 and, consequently, voltage U1 changes state. In response, voltage Q also changes state, and becomes equal to "1".

In the event that voltage Q is equal to "1", transistor T7 is conductive, and voltage VC1 is forced and held at the value of voltage Vss. In other words, capacitor C1 is discharged. At instant t1, voltage $\overline{Q}$ is thus equal to "0", and the situation for this voltage is similar to that at instant t0. Thus, from instant t1, capacitor C2 behaves as capacitor C1 behaved at instant t0, as illustrated by wave shape 63. At an instant t2, voltage VC2 reaches threshold voltage Vth2 and, consequently, voltage U2 changes state. In response, voltage Q again changes state, and again becomes equal to "0", as illustrated by wave shape 61. The situation is then similar to that at instant t0, and is repeated.

It is to be noted that voltage Q thus supplied has a square wave shape, the time interval between instants t0 and t2 defining the period T of this voltage.

By way of illustration only, the Applicant of the present invention has measured experimentally the variations in frequency f (linked to period T) of voltage Q. The Applicant observed that, when frequency f is equal to 1.2 Mhz, a variation of the order of 0.0015%/° C. was measured.

It goes without saying for those skilled in the art that the above detailed description may undergo various modifications without departing from the scope of the present invention. By way of example, the resistor of the reference source may be formed from three materials respectively having three different temperature coefficients.

What is claimed is:

1. An oscillator intended to supply a periodic electric voltage at a predetermined frequency, said oscillator including:

a reference source providing a reference voltage, the reference source including a resistor linked to affect the supply of said reference voltage and formed to give said reference source a first temperature coefficient, and supply means receiving said reference voltage and supplying said periodic voltage at said predetermined frequency, said supply means having a second temperature coefficient equal in absolute value to the first temperature coefficient so that the temperature variations of the reference source compensate for the temperature variations of the supply means so that said predetermined frequency of the periodic voltage remains independent of the temperature, wherein said resistor is formed of a first resistor formed from silicon having a first type of conductivity, and a second resistor formed from silicon having a second type of conductivity so that connecting said first resistor to said second resistor gives the reference source a first temperature coefficient equal in absolute value to the second temperature coefficient of the supply means.

2. An oscillator according to claim 1, wherein said first resistor is formed from silicon having a first type of highly doped conductivity, and wherein said second resistor is formed from silicon having a second type of lightly doped conductivity.

3. An oscillator according to claim 1, wherein said supply means includes first and second comparison means, and a flip-flop connected in a loop with each of said first and second comparison means, wherein said first and second comparison means can receive said reference voltage as well as first and second output voltages respectively, and supply in response first and second comparison voltages respectively, wherein said flip-flop can receive said first and second comparison voltages and provide in response said first and second output voltages respectively, one of said first and second output voltages corresponding to said periodic voltage.

4. An oscillator according to claim 3, wherein said first comparison means includes:

a first accumulator connected to ground and connected to a supply terminal via a first switch controlled by said first output voltage, and connected to ground via a second switch controlled by said reference voltage;

a first comparator able to compare a voltage present across terminals of said accumulator and a first threshold voltage supplied by first threshold voltage supply means, and to supply in response said first comparison voltage.

5. An oscillator according to claim 3, wherein said second comparison means include:

a second accumulator connected to ground and to a supply terminal via a third switch controlled by said second output voltage, and connected to ground via a fourth switch controlled by said reference voltage;

a first comparator comparing a voltage present across terminals of said second accumulator and a second threshold voltage supplied by first threshold voltage supply means, and, in response, supplying said second comparison voltage.

6. An oscillator according to claim 1, wherein said reference source and said supply means are formed in a monolithic manner in a single semiconductor substrate.

7. An oscillator supplying a periodic electric voltage at a predetermined frequency, the oscillator comprising:

a reference source providing a reference voltage, the reference source comprising a resistor linked to affect the supply of the reference voltage, the resistor comprising a first resistor formed from silicon having a first type of highly doped conductivity and a second resistor formed from silicon having a second type of lightly doped conductivity; and a supply means receiving said reference voltage and supplying said periodic voltage at said predetermined frequency, said supply means having a first temperature coefficient affecting said predetermined frequency, wherein said resistor is formed to give said reference source a second temperature coefficient equal to the first temperature coefficient so that temperature has the same influence on said reference source and on said supply means, which allows the periodic voltage to be supplied independently of temperature.

* * * * *